(12) United States Patent
Lin et al.

(10) Patent No.: US 11,688,683 B2
(45) Date of Patent: Jun. 27, 2023

(54) SEMICONDUCTOR STRUCTURE AND MANUFACTURING METHOD THEREOF

(71) Applicant: Powerchip Semiconductor Manufacturing Corporation, Hsinchu (TW)

(72) Inventors: Hsiao-Pei Lin, Miaoli County (TW); Shih-Ping Lee, Hsinchu (TW); Cheng-Zuo Han, Taipei (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 17/573,609

(22) Filed: Jan. 11, 2022

(65) Prior Publication Data

US 2022/0139825 A1 May 5, 2022

Related U.S. Application Data

(62) Division of application No. 16/877,502, filed on May 19, 2020, now Pat. No. 11,264,322.

(30) Foreign Application Priority Data

Apr. 13, 2020 (TW) .................................. 109112408

(51) Int. Cl.
*H01L 23/522* (2006.01)
*H01L 49/02* (2006.01)
*H01L 21/8249* (2006.01)

(52) U.S. Cl.
CPC ...... *H01L 23/5226* (2013.01); *H01L 23/5223* (2013.01); *H01L 28/60* (2013.01); *H01L 21/8249* (2013.01)

(58) Field of Classification Search
CPC . H01L 23/5226; H01L 23/5223; H01L 28/60; H01L 21/8249
USPC .......................................................... 257/773
See application file for complete search history.

(56) References Cited

U.S. PATENT DOCUMENTS 11,264,322 B2 * 3/2022 Lin ..................... H01L 23/5223

\* cited by examiner

*Primary Examiner* — Tu-Tu V Ho
(74) *Attorney, Agent, or Firm* — JCIPRNET

(57) ABSTRACT

A semiconductor structure and a manufacturing method thereof are provided. The semiconductor structure includes a substrate, a semiconductor device, an interconnect structure, a capacitor, and a plurality of pads. The semiconductor device is disposed at the substrate. The interconnect structure is disposed on the substrate and electrically connected to the semiconductor device. The capacitor is disposed on the interconnect structure and electrically connected to the interconnect structure. The capacitor includes a first electrode, a second electrode covering a top surface and a sidewall of the first electrode, and an insulating layer disposed between the first electrode and the second electrode. The plurality of pads are disposed on the interconnect structure and electrically connected to the interconnect structure, wherein at least one of the plurality of pads is electrically connected to the capacitor.

5 Claims, 11 Drawing Sheets

SEMICONDUCTOR STRUCTURE AND MANUFACTURING METHOD THEREOF

CROSS-REFERENCE TO RELATED APPLICATION

This application is a divisional application of and claims the priority benefit of U.S. application Ser. No. 16/877,502, filed on May 19, 2020, which claims the priority benefit of Taiwan application serial no. 109112408, filed on Apr. 13, 2020. The entirety of each of the above-mentioned patent applications is hereby incorporated by reference herein and made a part of this specification.

BACKGROUND OF THE INVENTION

Field of the Invention

The invention relates to a semiconductor structure and a manufacturing method thereof.

Description of Related Art

In today's semiconductor industry, capacitors are relatively important basic devices. For example, a metal-insulator-metal capacitor (MIM capacitor) is a common capacitor structure and is designed so that a dielectric layer is disposed between metal layers serving as electrodes such that the adjacent metal layers and the dielectric layer located between the two may form a capacitor unit.

In general, capacitors and other semiconductor devices (such as metal oxide semiconductor (MOS) transistors, memory devices, etc.) are disposed on a substrate, such that the layout area cannot be reduced. In addition, the capacitors may be disposed above the other semiconductor devices, and a subsequent interconnect structure is disposed above the capacitors and the other semiconductor devices. In this way, the layout area may be effectively reduced. However, this method causes the thickness of the semiconductor device to be increased.

SUMMARY OF THE INVENTION

The invention provides a semiconductor structure, wherein an upper electrode of a capacitor covers a top surface and a sidewall of a lower electrode of the capacitor.

The invention provides a manufacturing method of a semiconductor structure, wherein an upper electrode of a capacitor covers a top surface and a sidewall of a lower electrode of the capacitor.

The semiconductor structure of the invention includes a substrate, a semiconductor device, an interconnect structure, a capacitor, and a plurality of pads. The semiconductor device is disposed at the substrate. The interconnect structure is disposed on the substrate and electrically connected to the semiconductor device. The capacitor is disposed on the interconnect structure and electrically connected to the interconnect structure. The capacitor includes a first electrode, a second electrode covering a top surface and a sidewall of the first electrode, and an insulating layer disposed between the first electrode and the second electrode. The plurality of pads are disposed on the interconnect structure and electrically connected to the interconnect structure, wherein at least one of the plurality of pads is electrically connected to the capacitor.

In an embodiment of the semiconductor structure of the invention, a conductive layer connected to the capacitor and the at least one of the plurality of pads is further included.

In an embodiment of the semiconductor structure of the invention, the at least one of the plurality of pads is extended onto a top surface and a sidewall of the capacitor.

In an embodiment of the semiconductor structure of the invention, the at least one of the plurality of pads is extended onto a sidewall of the capacitor.

In an embodiment of the semiconductor structure of the invention, a barrier layer disposed between the insulating layer and the first electrode is further included.

A manufacturing method of a semiconductor structure of the invention includes the following steps. A semiconductor device is formed at a substrate. An interconnect structure is formed on the substrate, wherein the semiconductor device is formed on the substrate, and the interconnect structure is electrically connected to the semiconductor device. A capacitor and a plurality of pads are formed on the interconnect structure. The capacitor is disposed on the interconnect structure and electrically connected to the interconnect structure. The capacitor includes a first electrode, a second electrode, and an insulating layer disposed between the first electrode and the second electrode. The second electrode covers a top surface and a sidewall of the first electrode. The capacitor and the plurality of pads are respectively electrically connected to the interconnect structure, and at least one of the plurality of pads is electrically connected to the capacitor.

In an embodiment of the manufacturing method of the semiconductor structure of the invention, a forming method of the capacitor includes the following steps. The first electrode is formed on the interconnect structure. An insulating material layer and a conductive material layer are sequentially formed on the interconnect structure, wherein the insulating material layer and the first conductive material layer cover the top surface and the sidewall of the first electrode. The insulating material layer and the first conductive material layer are patterned to form the insulating layer and the second electrode.

In an embodiment of the manufacturing method of the semiconductor structure of the invention, after the first electrode is formed, a barrier layer is further formed on the top surface and the sidewall of the first electrode.

In an embodiment of the manufacturing method of the semiconductor structure of the invention, a forming method of the plurality of pads includes the following steps. After the capacitor is formed, a second conductive material layer is formed on the interconnect structure, wherein the second conductive material layer covers a top surface and a sidewall of the capacitor. A planarization process is performed to remove a portion of the second conductive material layer until the top surface of the capacitor is exposed. The remaining second conductive material layer is patterned to form the plurality of pads, wherein the plurality of pads are separated from the capacitor. A conductive layer is formed on the capacitor and the at least one of the plurality of pads to connect the capacitor and the at least one of the plurality of pads.

In an embodiment of the manufacturing method of the semiconductor structure of the invention, a forming method of the plurality of pads includes the following steps. After the capacitor is formed, a second conductive material layer is formed on the interconnect structure, wherein the second conductive material layer covers a top surface and a sidewall of the capacitor. The second conductive material layer is patterned to form the plurality of pads, wherein the at least one of the plurality of pads is extended onto the top surface and the sidewall of the capacitor, and the rest of the plurality of pads are separated from the capacitor.

In an embodiment of the manufacturing method of the semiconductor structure of the invention, a forming method of the plurality of pads includes the following steps. After the capacitor is formed, a second conductive material layer is formed on the interconnect structure, wherein the second conductive material layer covers a top surface and a sidewall of the capacitor. A planarization process is performed to remove a portion of the second conductive material layer until the top surface of the capacitor is exposed. The remaining second conductive material layer is patterned to form the plurality of pads, wherein the at least one of the plurality of pads is extended onto the sidewall of the capacitor, and the rest of the plurality of pads are separated from the capacitor.

A semiconductor structure of the invention includes a substrate, a semiconductor device, an interconnect structure, a capacitor, and a plurality of pads. The semiconductor device is disposed at the substrate. The interconnect structure is disposed on the substrate and electrically connected to the semiconductor device. The capacitor is disposed on the interconnect structure and electrically connected to the interconnect structure. The capacitor includes a first electrode, a second electrode disposed on the first electrode, and an insulating layer disposed between the first electrode and the second electrode. The plurality of pads are disposed on the interconnect structure and electrically connected to the interconnect structure. The plurality of pads are separated from the first electrode, and the second electrode is extended onto at least one of the plurality of pads.

In an embodiment of the semiconductor structure of the invention, the second electrode covers at least a portion of a top surface of the at least one of the plurality of pads.

In an embodiment of the semiconductor structure of the invention, isolation structures disposed between the pads and the capacitor and between adjacent pads are further included.

A manufacturing method of a semiconductor structure of the invention includes the following steps. A semiconductor device is formed at a substrate. An interconnect structure is formed on the substrate, wherein the semiconductor device is formed on the substrate, and the interconnect structure is electrically connected to the semiconductor device. A capacitor and a plurality of pads are formed on the interconnect structure. The capacitor is disposed on the interconnect structure and electrically connected to the interconnect structure. The capacitor includes a first electrode, a second electrode disposed on the first electrode, and an insulating layer disposed between the first electrode and the second electrode. The capacitor and the plurality of pads are respectively electrically connected to the interconnect structure, the plurality of pads are separated from the first electrode, and the second electrode is extended onto at least one of the plurality pads.

In an embodiment of the manufacturing method of the semiconductor structure of the invention, a forming method of the capacitor and the plurality of pads includes the following steps. A conductive layer is formed on the interconnect structure. The conductive layer is patterned to form the first electrode and the plurality of pads. An insulating material layer is formed on the first electrode and the plurality of pads. The insulating material layer on the plurality of pads is removed. The second electrode is formed on the insulating material layer on the first electrode and the at least one of the plurality of pads.

In an embodiment of the manufacturing method of the semiconductor structure of the invention, after the first electrode and the plurality of pads are formed and before the insulating material layer is formed, isolation structures are further formed between the pads and the first electrode and between adjacent pads.

In an embodiment of the manufacturing method of the semiconductor structure of the invention, the second electrode covers at least a portion of a top surface of the at least one of the plurality of pads.

Based on the above, in the invention, the upper electrode of the capacitor covers the top surface and the sidewall of the lower electrode of the capacitor. Therefore, the coverage between the upper electrode and the lower electrode may be increased, and therefore the capacitance of the capacitor may be increased. In addition, in the invention, the uppermost metal layer in the semiconductor device is used as the lower electrode and the pads of the capacitor. Therefore, the thickness and layout area of the semiconductor device may be effectively reduced, and therefore the size of the semiconductor device may be reduced.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
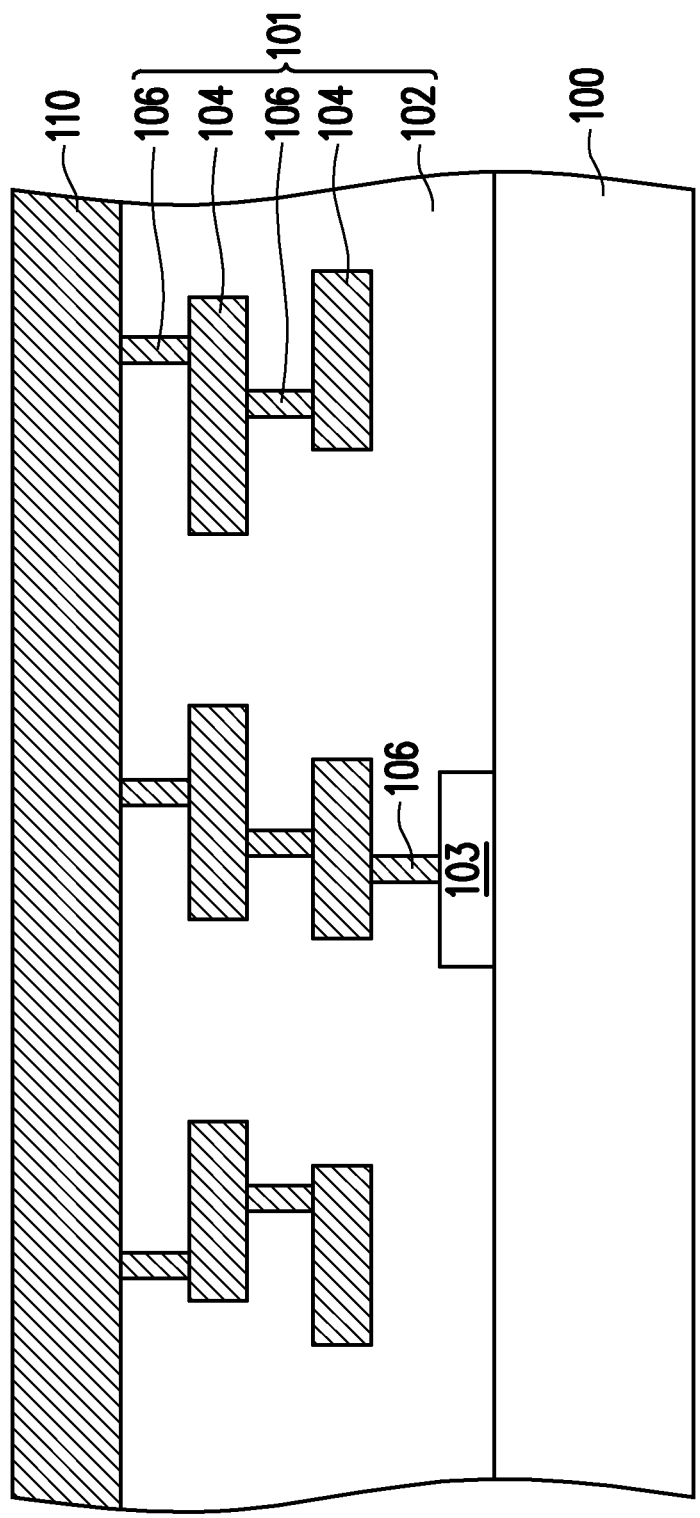
FIG. 1A to FIG. 1D are cross-sectional views of a manufacturing process of a semiconductor structure according to the first embodiment of the invention.

Embodiments are provided hereinafter and described in detail with reference to figures. However, the embodiments provided are not intended to limit the scope of the invention. Moreover, the figures are only descriptive and are not drawn to scale. For ease of explanation, the same devices below are provided with the same reference numerals.

Terms such as "contain", "include", and "have" used in the specification are all open terms, i.e., "contains, but not limited to".

In addition, the directional terms such as "upper" and "lower" mentioned in the text are only used to refer to the directions of the figures, and not to limit the invention.

When describing the devices in terms of "first", "second", etc., the terms are only used to distinguish the devices from each other, and do not limit the order or importance of the devices. Therefore, in some cases, the first device may also be called the second device, and the second device may also be called the first device, and this does not deviate from the scope of the patent application.

FIG. 1A to FIG. 1D are cross-sectional views of a manufacturing process of a semiconductor structure according to the first embodiment of the invention.

First, referring to FIG. 1A, a substrate 100 is provided. The substrate 100 is, for example, a silicon substrate. Then, a first semiconductor device 103 is formed on the substrate 100. In the present embodiment, the type of the semiconductor device 103 is not limited. In addition, in the present embodiment, the semiconductor device 103 is formed on the substrate 100, and in another embodiment, the semiconductor device 103 may also be formed in the substrate 100. For example, the semiconductor device 103 may be a metal oxide semiconductor transistor, a memory device, a doped region, or the like. In FIG. 1A, for clarity, only one semiconductor device is shown, but the invention does not limit the number of the semiconductor device 103.

Next, an interconnect structure 101 is formed on the substrate 100. As is known to those skilled in the art, the interconnect structure 101 is used to conduct an electrical signal applied to a semiconductor device. The interconnect structure 101 includes a multilayer circuit layer and a plurality of contacts provided in the dielectric layer. The contacts are used to connect the circuit layers, connect the lowermost circuit layer and the semiconductor device 103, and connect the uppermost circuit layer and pads disposed on the interconnect structure 101. In the present embodiment, the interconnect structure 101 includes a dielectric layer 102, circuit layers 104, and contacts 106. The lowermost circuit layer 104 is connected to the semiconductor device 103 via the lowermost contact 106. In addition, in FIG. 1A, for clarity, only two of the circuit layers 104 are shown, but the invention does not limit the number of the circuit layers 104.

Then, a conductive layer 110 is formed on the interconnect structure 101 (on the surface of the dielectric layer 102). The conductive layer 110 is, for example, an aluminum layer or a composite layer formed by a titanium layer/titanium nitride layer/aluminum layer/titanium nitride layer/titanium layer, and the invention is not limited thereto. In the present embodiment, the conductive layer 110 is used to form a lower electrode of a capacitor disposed on the interconnect structure 101. In general, the conductive layer 110 may be regarded as the uppermost metal layer in the semiconductor device.

Figure 1B:
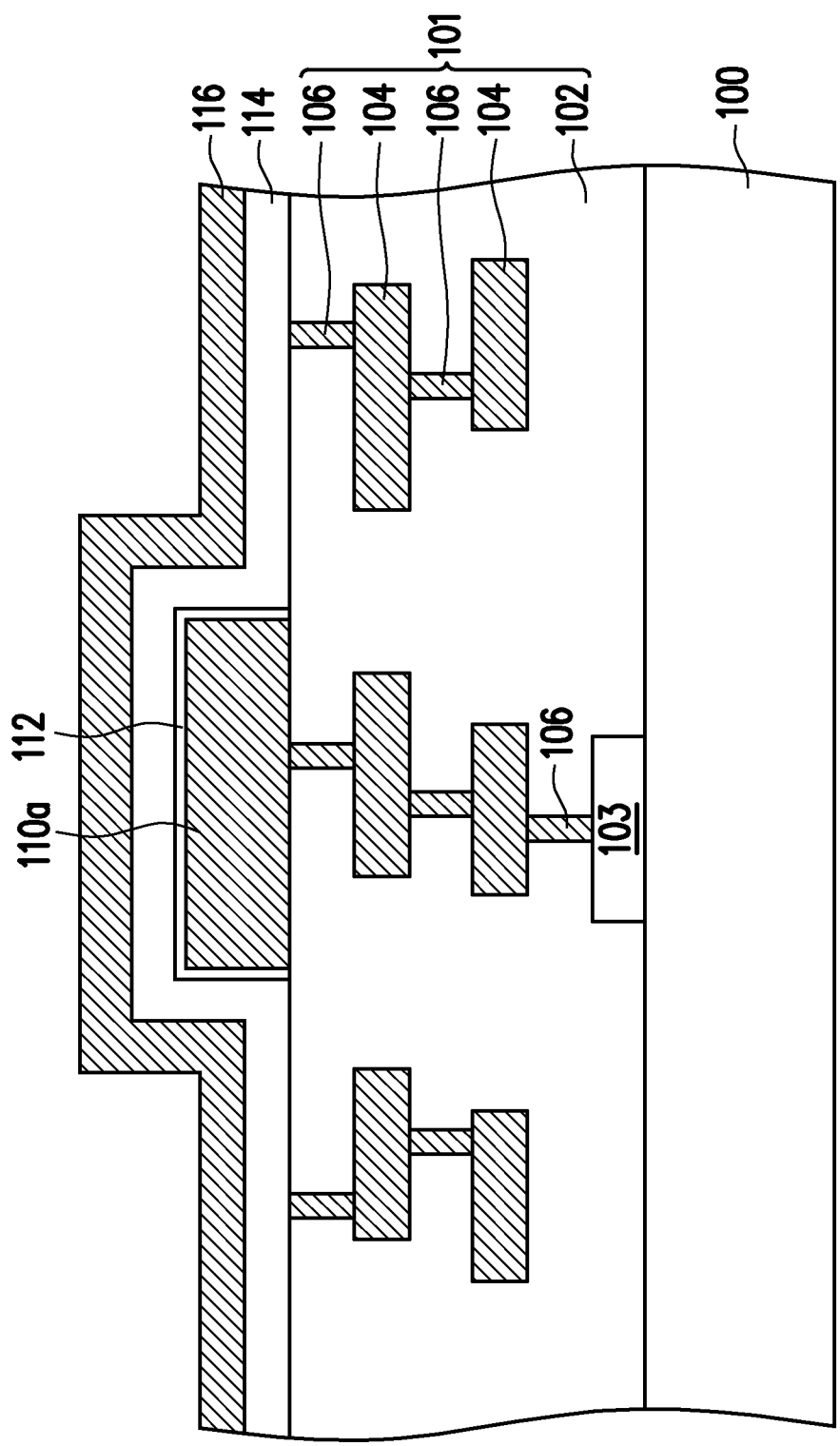

Next, referring to FIG. 1B, the conductive layer 110 is patterned to form a first electrode 110a (lower electrode) of the capacitor. The first electrode 110a is electrically connected to the interconnect structure 101 via the uppermost contact 106. In addition, after the first electrode 110a is formed, a barrier layer 112 may be formed on the top surface and the sidewall of the first electrode 110a. The barrier layer 112 is, for example, a composite layer formed by a titanium layer/titanium nitride layer. According to actual requirements, in other embodiments, the barrier layer 112 may be omitted. Then, an insulating material layer 114 and a conductive material layer 116 are sequentially formed on the interconnect structure 101. The insulating material layer 114 is, for example, a high dielectric constant material layer. The conductive material layer 116 may be a material layer generally used as an upper electrode of a capacitor, and the invention is not limited in this regard.

Figure 1C:
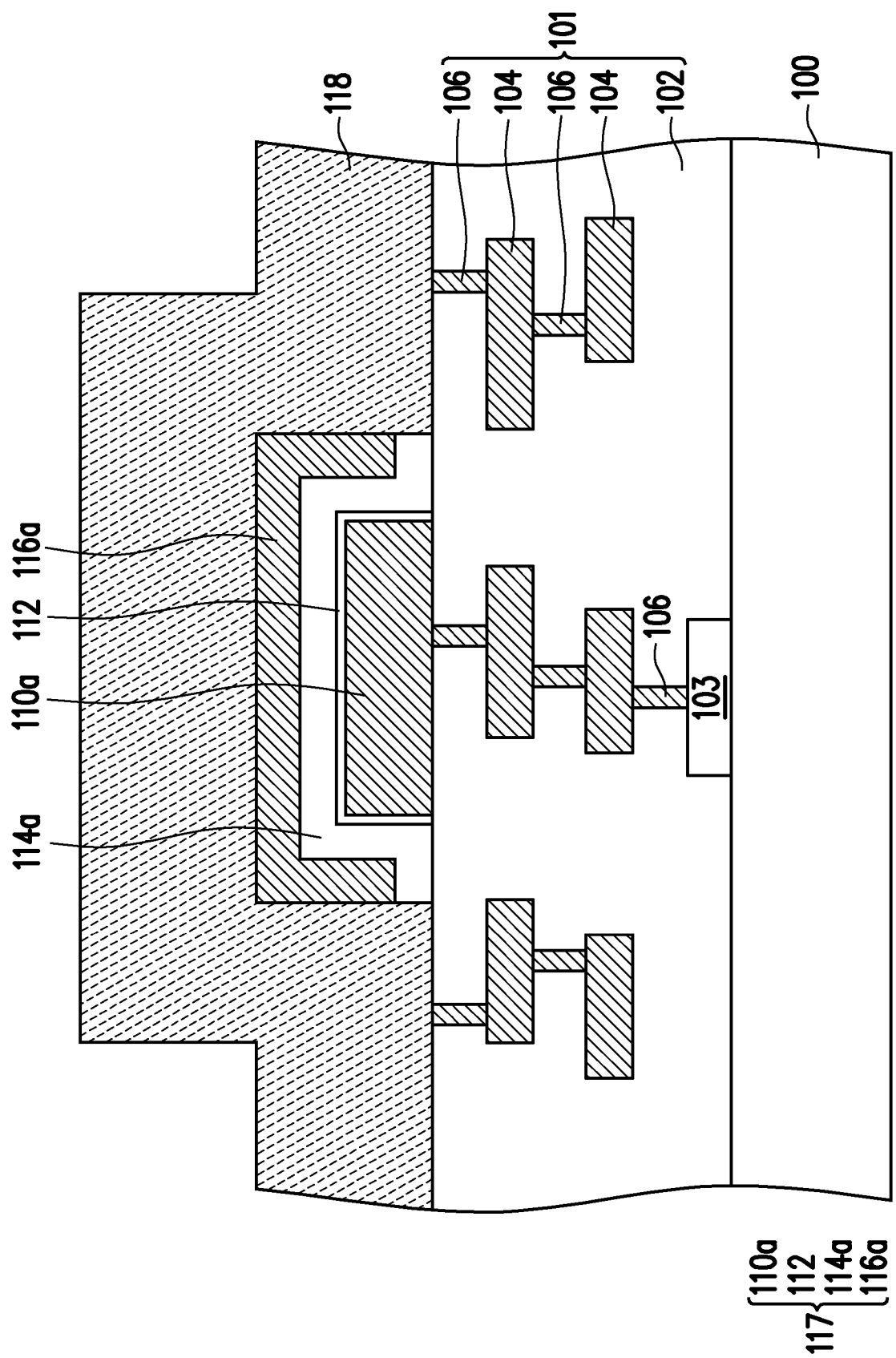

Then, referring to FIG. 1C, the insulating material layer 114 and the conductive material layer 116 are patterned to form an insulating layer 114a and a second electrode 116a (upper electrode). In this way, a capacitor 117 formed by the first electrode 110a, the barrier layer 112, the insulating layer 114a, and the second electrode 116a is formed. In the present embodiment, during the patterning process, a mask layer (such as a photoresist layer, not shown) for defining the insulating layer 114a and the second electrode 116a covers the insulating material layer 114 and the conductive material layer 116 on the sidewall of the first electrode 110a. Therefore, the resulting insulating layer 114a and the second electrode 116a may both cover the sidewall of the first electrode 110a. That is to say, in the resulting capacitor 117, the second electrode 116a covers the top surface and the sidewall of the first electrode 110a. Therefore, the coverage between the second electrode 116a and the first electrode 110a may be increased, thereby improving the capacitance of the capacitor 117.

After the capacitor 117 is formed, a conductive material layer 118 is formed on the interconnect structure 101. The conductive material layer 118 covers the top surface and the sidewall of the capacitor 117. The conductive material layer 118 is, for example, an aluminum layer, and the invention is not limited in this regard. The conductive material layer 118 is used to form the pads disposed on the interconnect structure 101. Therefore, the conductive material layer 118 and the first electrode 110a may be simultaneously regarded as the uppermost metal layer in the semiconductor device.

Figure 1D:
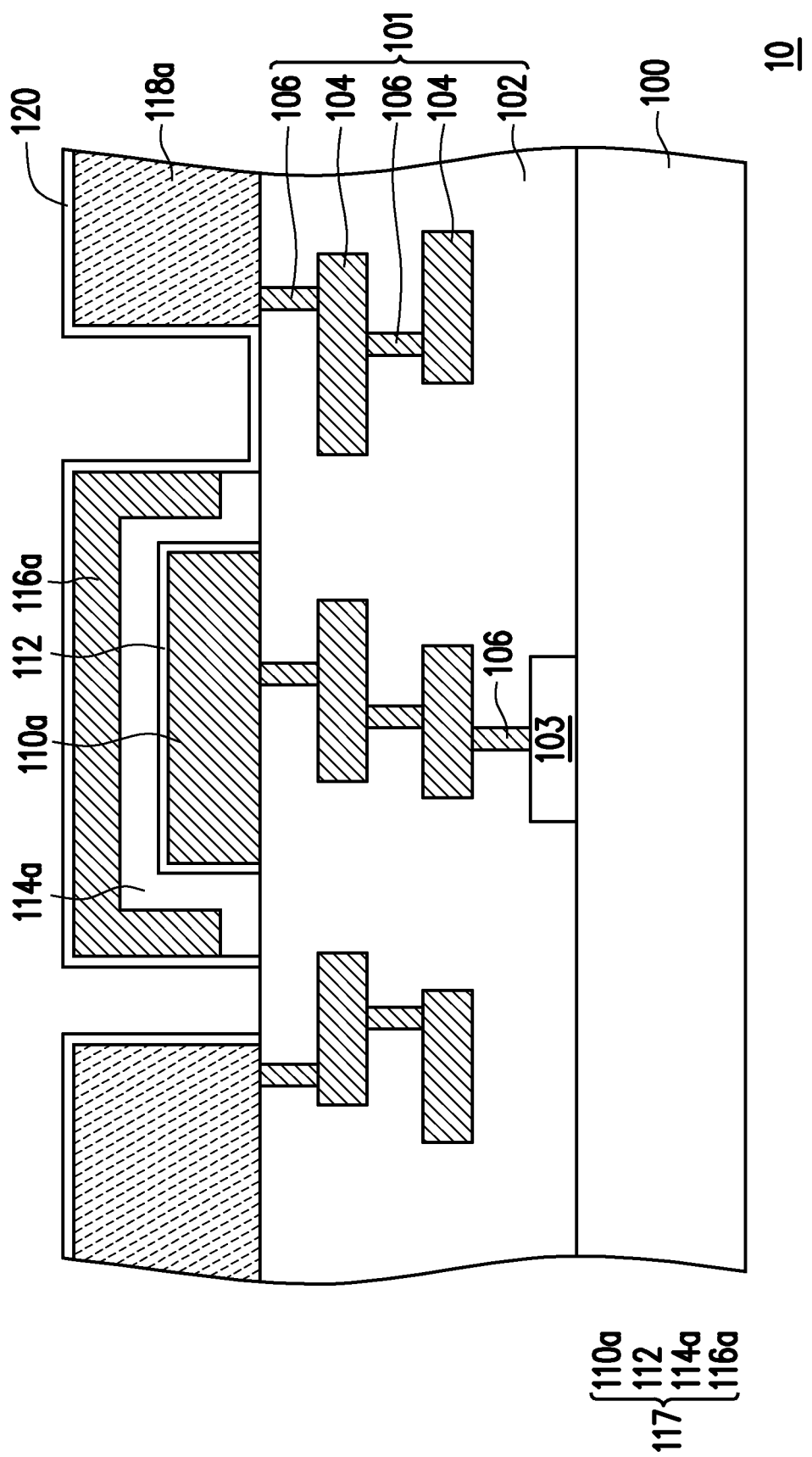

Next, referring to FIG. 1D, a planarization process is performed to remove a portion of the conductive material layer 118 until the top surface of the capacitor 117 (the top surface of the second electrode 116a) is exposed. The planarization process is, for example, a chemical mechanical polishing (CMP) process. Then, the remaining conductive material layer 118 is patterned to form pads 118a separated from the capacitor 117, and the pads 118a are electrically connected to the interconnect structure 101 via the uppermost contact 106. Then, a conductive layer 120 is formed on the capacitor 117 and at least one of the pads 118a adjacent to the capacitor 117, such that the capacitor 117 is electrically connected to the pads 118a via the conductive layer 120. The conductive layer 120 is, for example, a composite layer formed by a titanium layer/titanium nitride layer, but the invention is not limited thereto. In this way, a semiconductor structure 10 of the present embodiment is completed.

The above method of forming the conductive layer 120 connected to the capacitor 117 and the pads 118a includes, for example, first conformally forming a conductive material layer on the interconnect structure 101, and then patterning the conductive material layer to remove a portion of the conductive material layer such that the capacitor 117 may be connected to the desired pads 118a via the conductive layer 120 and not be connected to the other pads 118a. In the present embodiment, only the pad located on one side of the capacitor 117 is connected to the capacitor 117 via the conductive layer 120, but the invention is not limited thereto. In other embodiments, the pads located on both sides of the capacitor 117 may both be connected to the capacitor 117 via the conductive layer 120.

Then, other subsequent processes may be performed. For example, a dielectric layer covering the capacitor 117 and the pads 118a is formed, an opening exposing the pads 118a is formed in the dielectric layer, and a connecting member (e.g., solder ball, etc.) connected to the pads 118a is formed in the opening. Since the capacitor 117 is connected to the pads 118a via the conductive layer 120, an electrical signal transmitted via the connecting member may be simultaneously transmitted to the capacitor 117 and the pads 118a.

In the present embodiment, since the uppermost metal layer in the semiconductor device is used as the lower electrode (the first electrode 110a) and the pads 118a of the capacitor 117, the thickness and layout area of the semiconductor device may be effectively reduced, thus reducing the size of the semiconductor device.

Figure 2A:
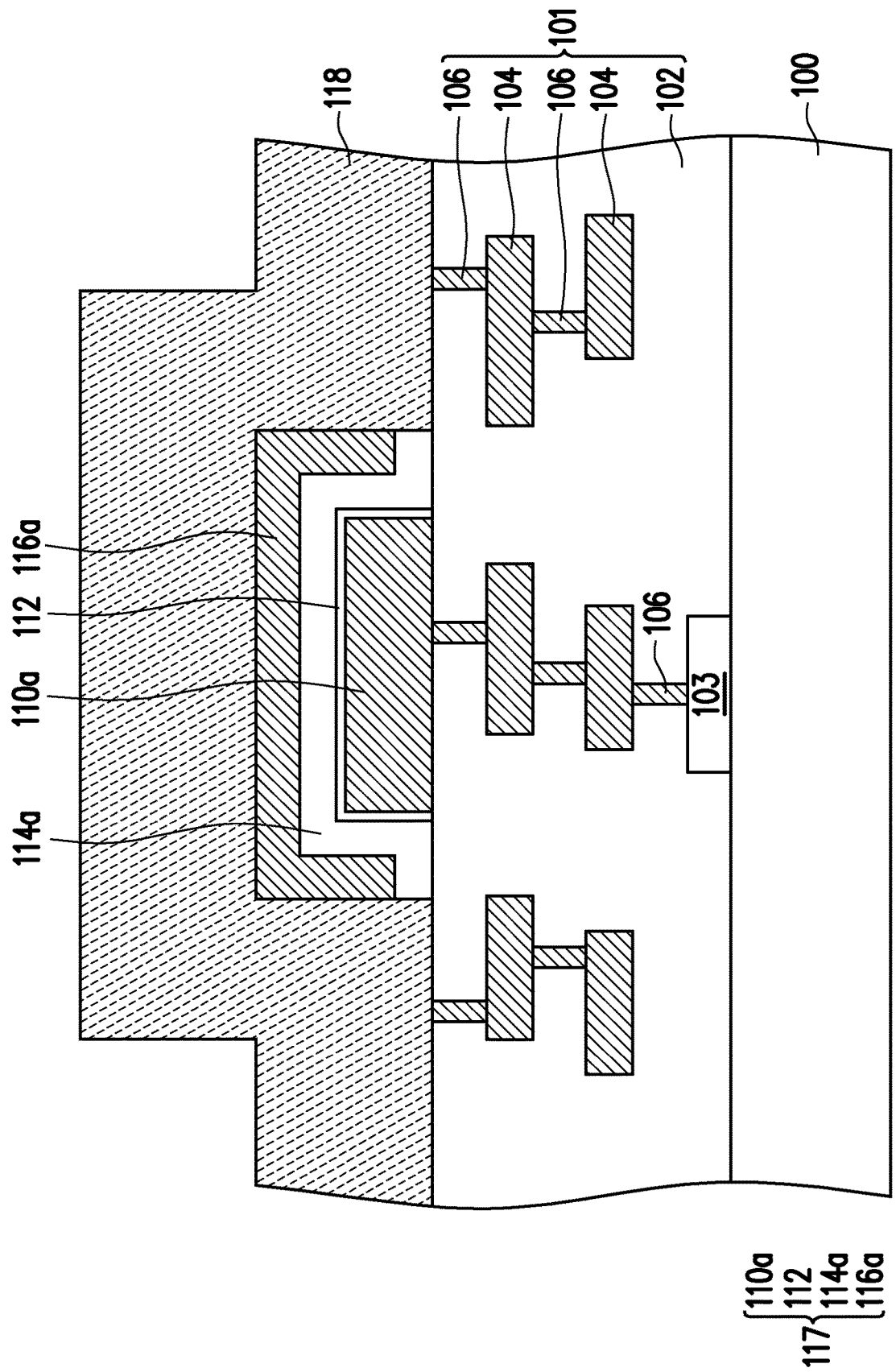
FIG. 2A to FIG. 2B are cross-sectional views of a manufacturing process of a semiconductor structure according to the second embodiment of the invention.
Figure 2B:
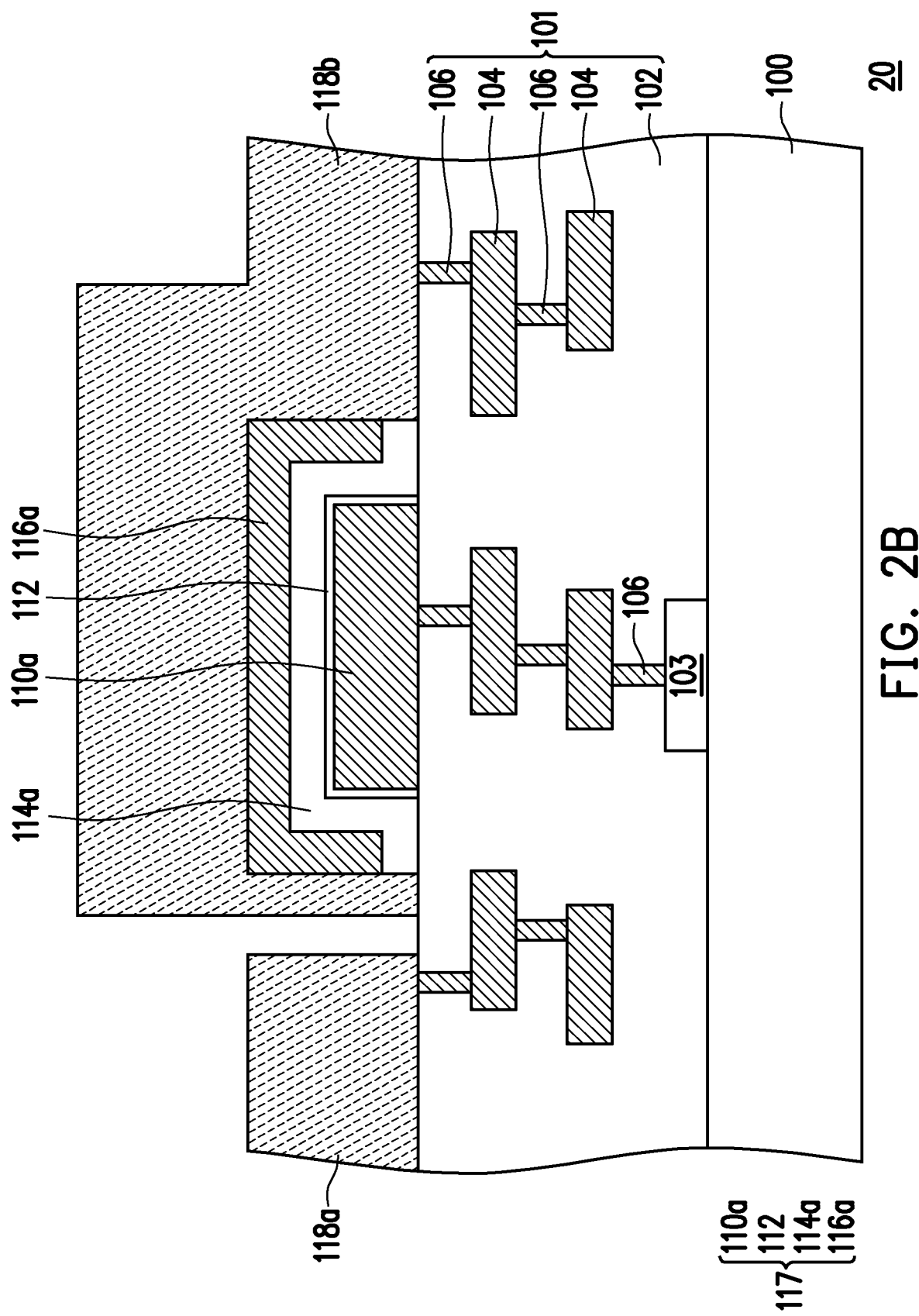

FIG. 2A to FIG. 2B are cross-sectional views of a manufacturing process of a semiconductor structure according to the second embodiment of the invention. In the present embodiment, the same devices as the first embodiment are labeled with the same reference numerals and are not repeated herein.

First, referring to FIG. 2A, the steps described in FIG. 1A to FIG. 1C are performed. In the present embodiment, after the conductive material layer 118 is formed, no planarization process is performed.

Then, referring to FIG. 2B, the conductive material layer 118 is patterned to form the pad 118a separated from the capacitor 117 and a pad 118b connected to the capacitor 117. The pad 118a is electrically connected to the interconnect structure 101 via the uppermost contact 106. In addition, the pad 118b is electrically connected to the interconnect structure 101 via the uppermost contact 106, and is extended onto the top surface and the sidewall of the capacitor 117. In this way, a semiconductor structure 20 of the present embodiment is completed.

In the present embodiment, only the pad located on one side of the capacitor 117 are connected to the capacitor 117, but the invention is not limited thereto. In other embodiments, the pads located on both sides of the capacitor 117 may both may be connected to the capacitor 117.

In the present embodiment, since the uppermost metal layer in the semiconductor device is used as the lower electrode (the first electrode 110a) and the pads 118a and 118b of the capacitor 117, the thickness and layout area of the semiconductor device may be effectively reduced, thus reducing the size of the semiconductor device.

Figure 3A:
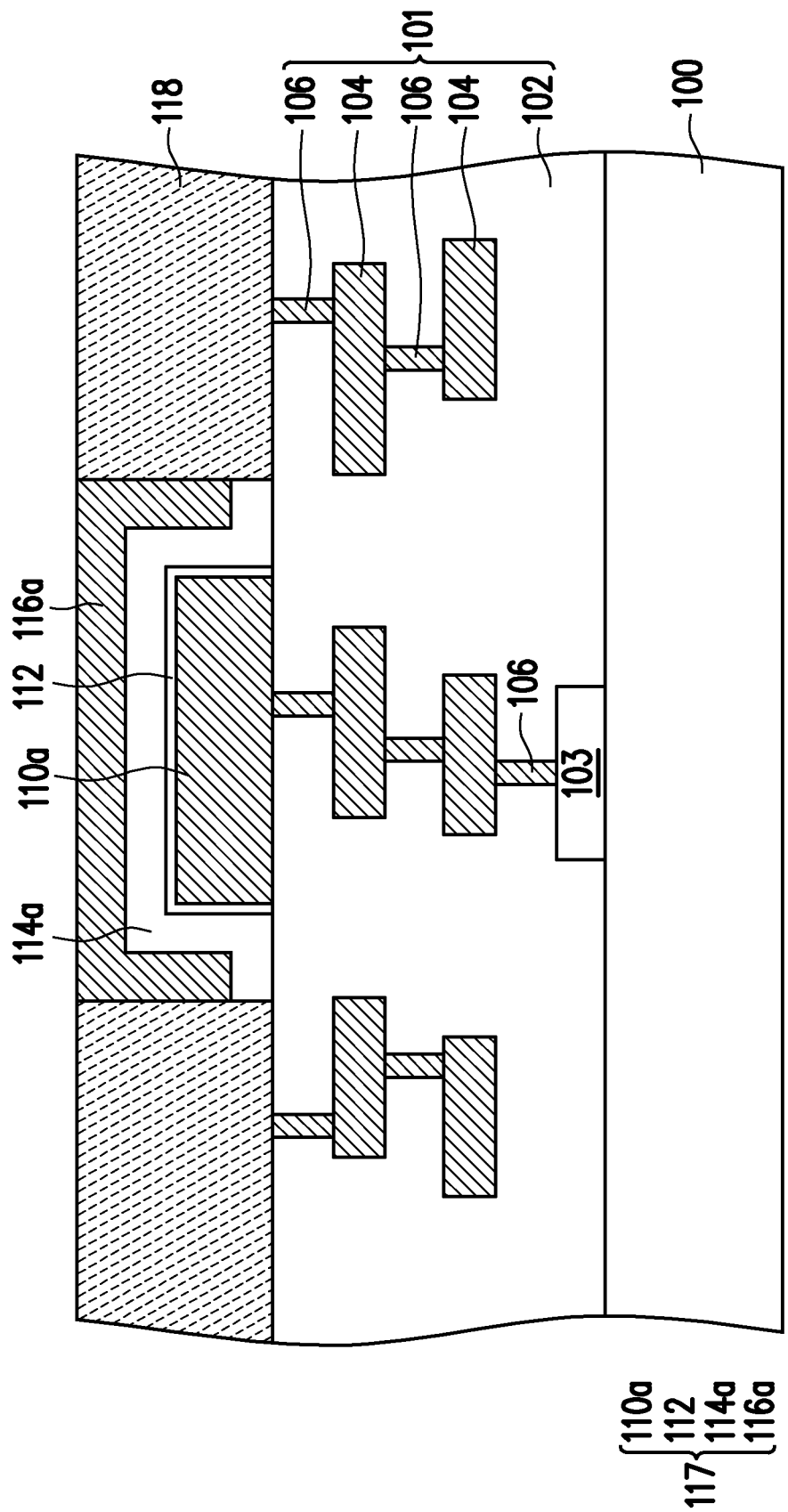
FIG. 3A to FIG. 3B are cross-sectional views of a manufacturing process of a semiconductor structure according to the third embodiment of the invention.
Figure 3B:
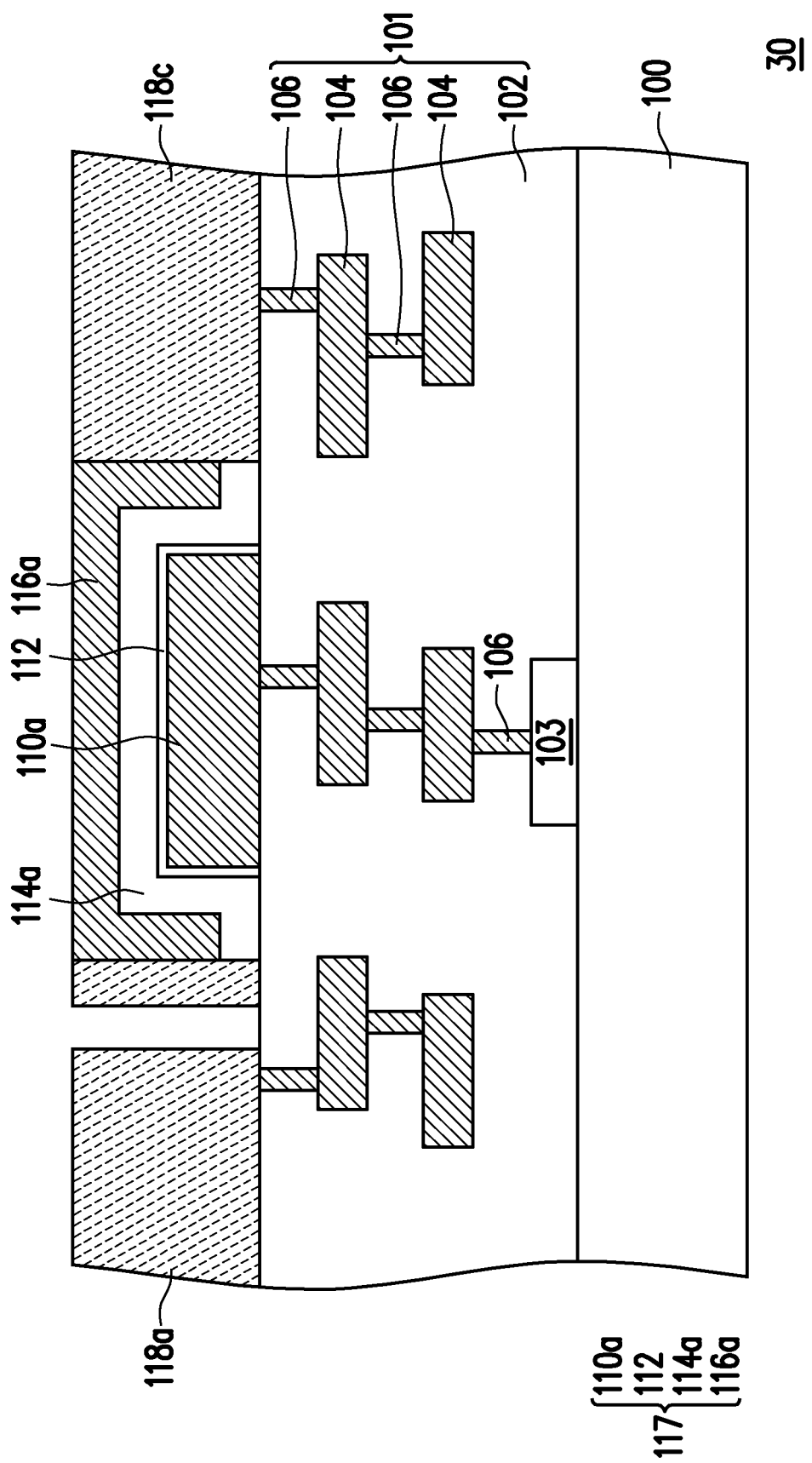

FIG. 3A to FIG. 3B are cross-sectional views of a manufacturing process of a semiconductor structure according to the third embodiment of the invention. In the present embodiment, the same devices as the first embodiment are labeled with the same reference numerals and are not repeated herein.

First, referring to FIG. 3A, the steps described in FIG. 1A to FIG. 1C are performed. In the present embodiment, after the conductive material layer 118 is formed, a portion of the conductive material layer 118 is removed until the top surface of the capacitor 117 (the top surface of the second electrode 116a) is exposed.

Then, referring to FIG. 3B, the remaining conductive material layer 118 is patterned to form the pad 118a separated from the capacitor 117 and a pad 118c connected to the capacitor 117. The pad 118a is electrically connected to the interconnect structure 101 via the uppermost contact 106. In addition, the pad 118c is electrically connected to the interconnect structure 101 via the uppermost contact 106, and is extended onto the sidewall of the capacitor 117. In this way, a semiconductor structure 30 of the present embodiment is completed.

In the present embodiment, only the pad located on one side of the capacitor 117 is connected to the capacitor 117, but the invention is not limited thereto. In other embodiments, the pads located on both sides of the capacitor 117 may both may be connected to the capacitor 117.

In the present embodiment, since the uppermost metal layer in the semiconductor device is used as the lower electrode (the first electrode 110a) and the pads 118a and 118c of the capacitor 117, the thickness and layout area of the semiconductor device may be effectively reduced, thus reducing the size of the semiconductor device.

Figure 4A:
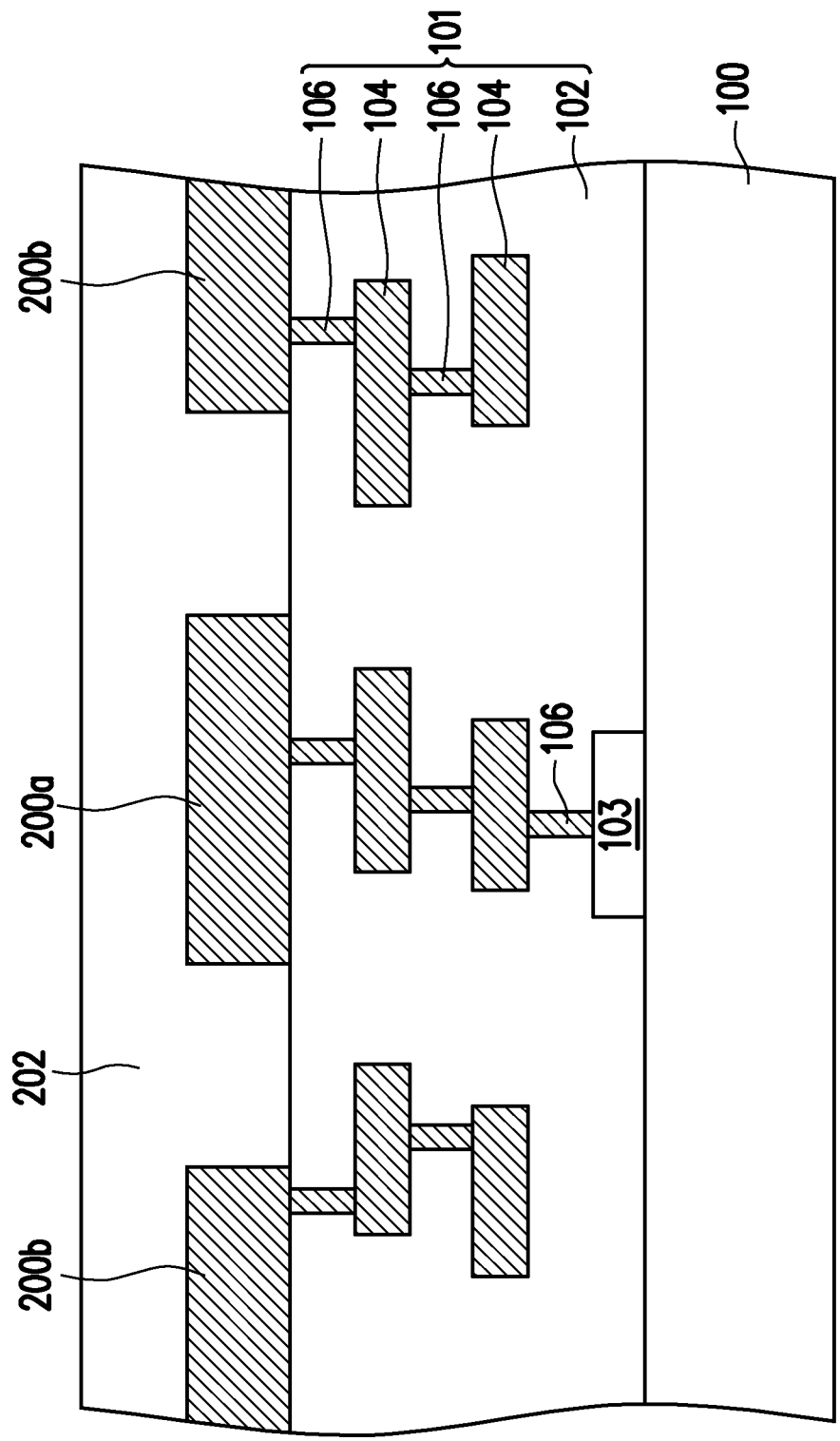
FIG. 4A to FIG. 4C are cross-sectional views of a manufacturing process of a semiconductor structure according to the fourth embodiment of the invention.
Figure 4B:
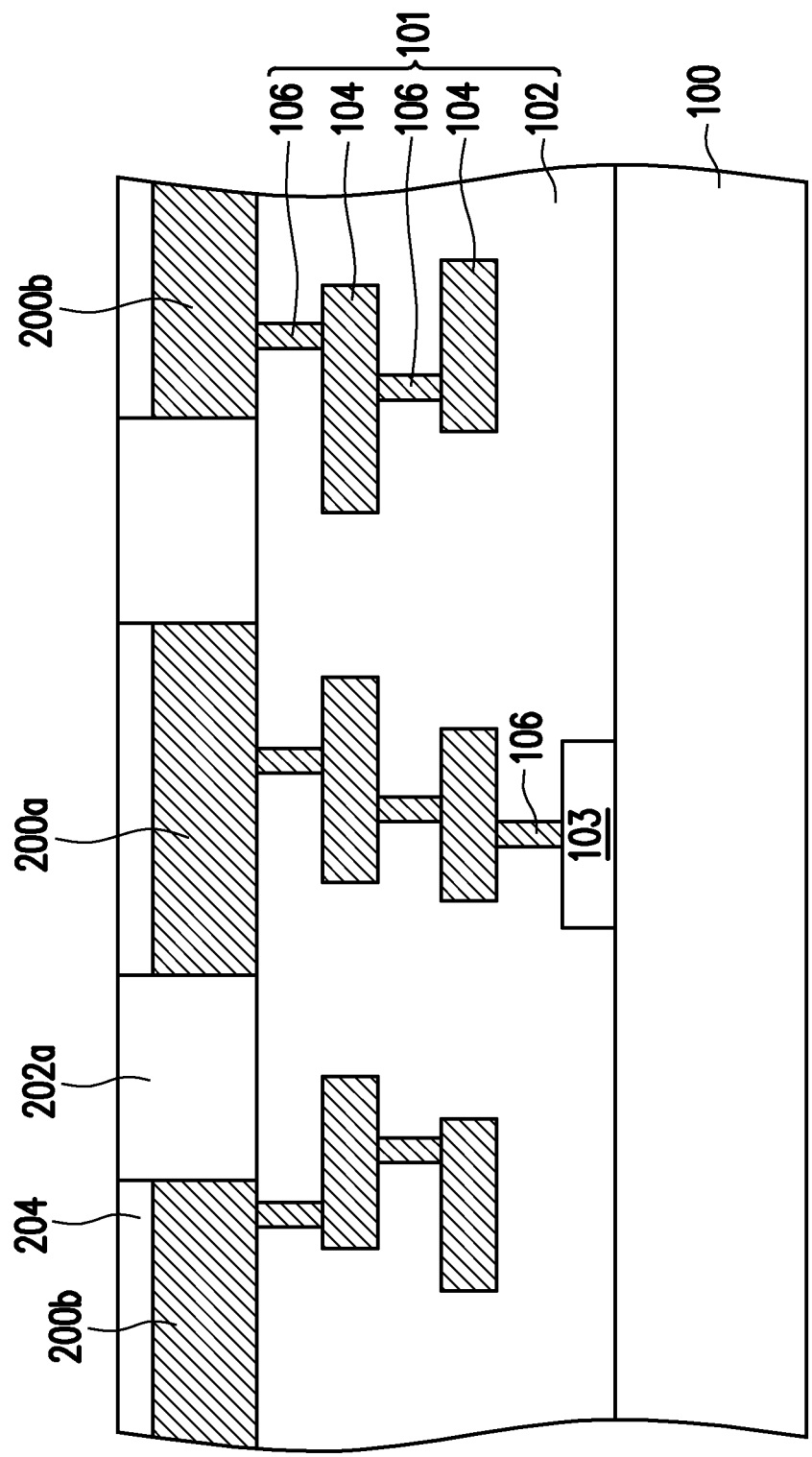
Figure 4C:
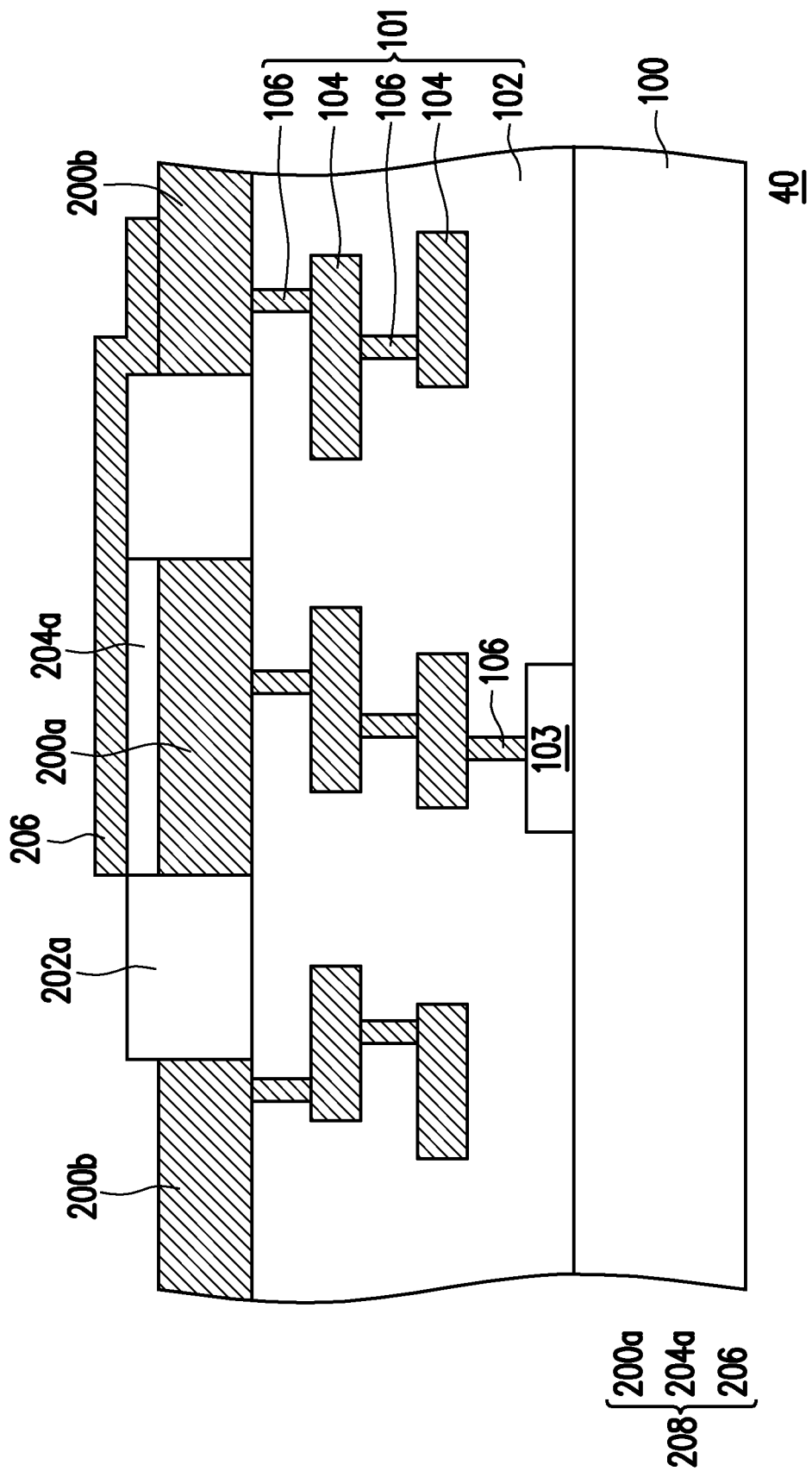

FIG. 4A to FIG. 4C are cross-sectional views of a manufacturing process of a semiconductor structure according to the fourth embodiment of the invention. In the present embodiment, the same devices as the first embodiment are labeled with the same reference numerals and are not repeated herein.

First, referring to FIG. 4A, the step described in FIG. 1A is performed. Next, the conductive layer 110 is patterned to form a first electrode 200a (lower electrode) of the capacitor and pads 200b separated from the first electrode 200a. The first electrode 200a is electrically connected to the interconnect structure 101 via the uppermost contact 106, and the pads 200b are electrically connected to the interconnect structure 101 via the uppermost contact 106. Similar to the first embodiment, after the first electrode 200a and the pads 200b are formed, a barrier layer (not formed in the present embodiment) may be formed on the top surfaces and the sidewalls of the first electrode 200a and the pads 200b. Then, an isolation material layer 202 is formed on the interconnect structure 101. The isolation material layer 202 covers the first electrode 200a and the pads 200b.

Then, referring to FIG. 4B, the isolation material layer 202 on the first electrode 200a and the pads 200b is removed to expose the top surface of the first electrode 200a and the top surface of the pads 200b, and isolation structures 202a are formed between the first electrode 200a and the pads 200b and between adjacent pads 200b. A method of removing the isolation material layer 202 on the first electrode 200a and the pads 200b includes, for example, first forming a mask layer (such as a photoresist layer) exposing an area above the first electrode 200a and the pads 200b on the isolation material layer 202, and then performing an etching process to remove the exposed isolation material layer 202, and then removing the mask layer. In the present embodiment, the mask layer completely covers the area between the first electrode 200a and the pads 200b and the area between adjacent pads 200b, and does not cover the area above the first electrode 200a and the pads 200b, but the invention is not limited thereto. In other embodiments, the mask layer may only cover a portion of the area between the first electrode 200a and the pads 200b and a portion of the area between adjacent pads 200b. Therefore, the width of the resulting isolation structures is less than the width of the isolation structures 202a. That is, the resulting isolation structures are not in contact with the first electrode 200a and the pads 200b. Alternatively, in other embodiments, the mask layer not only completely covers the area between the first electrode 200a and the pads 200b and the area between adjacent pads 200b, but also covers a portion of the area above the first electrode 200a and the pads 200b. Therefore, the width of the resulting isolation structures is greater than the width of the isolation structures 202a. That is, the isolation structures cover a portion of the top surface of the first electrode 200a and a portion of the top surface of the pads 200b.

Next, an insulating material layer 204 is formed on the top surface of the first electrode 200a and the top surface of the pads 200b. The insulating material layer 204 is, for example, a high dielectric constant material layer.

Then, referring to FIG. 4C, the insulating material layer 204 on the pads 200b is removed to form an insulating layer 204a on the first electrode 200a. A method of removing the insulating material layer 204 on the pads 200b includes, for example, forming a mask layer (such as a photoresist layer) on the insulating material layer 204 on the first electrode 200a, and then performing an etching process to remove the exposed insulating material layer 204, and then removing the mask layer. Next, a conductive layer 206 is formed on the first electrode 200a, an adjacent pad 200b, and the isolation structure 202a between the two. The conductive layer 206 on the first electrode 200a is used as a second electrode (upper electrode) of the capacitor. That is, in the present embodiment, the first electrode 200a, the insulating layer 204a, and the conductive layer 206 form a capacitor 208, and the upper electrode of the capacitor 208 is extended onto the adjacent pad 200b to cover at least a portion of the top surface thereof. In this way, a semiconductor structure 40 of the present embodiment is completed.

Then, other subsequent processes may be performed. For example, a dielectric layer covering the capacitor 208 and the pad 200b is formed, an opening exposing the pad 200b is formed in the dielectric layer, and a connecting member (e.g., solder ball, etc.) connected to the pad 200b is formed in the opening. Since the capacitor 208 is connected to the pad 200b via the upper electrode, an electrical signal transmitted via the connecting member may be simultaneously transmitted to the capacitor 208 and the pads 200b.

In the present embodiment, the upper electrode of the capacitor 208 only covers the pad on one side, but the invention is not limited thereto. In other embodiments, the upper electrode of the capacitor 208 may cover the pads on both sides.

In the present embodiment, since the uppermost metal layer in the semiconductor device is used as the lower electrode (the first electrode 200a) and the pads 200b of the capacitor 208, the thickness and layout area of the semiconductor device may be effectively reduced, thus reducing the size of the semiconductor device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:
    a substrate;
    a semiconductor device disposed at the substrate;
    an interconnect structure disposed on the substrate and electrically connected to the semiconductor device;
    a capacitor disposed on the interconnect structure and electrically connected to the interconnect structure;
    a plurality of first conductive features disposed on the interconnect structure and at one side of the capacitor and electrically connected to the interconnect structure;
    a first isolation layer disposed between the capacitor and one of plurality of the first conductive features which is closest to the capacitor;
    a plurality of second conductive features disposed on the interconnect structure and at another side of the capacitor and electrically connected to the interconnect structure; and
    a second isolation layer disposed between the capacitor and one of plurality of the second conductive features which is closest to the capacitor,
    wherein a top electrode of the capacitor has an extension portion located on the first isolation layer and at least the one of the plurality of the first conductive features which is closest to the capacitor, and
    wherein the capacitor, the plurality of first conductive features and the plurality of second conductive features are in contact with a dielectric layer of the interconnect structure.

2. The semiconductor structure of claim 1, wherein the top electrode covers at least a portion of a top surface of the one of the plurality of the first conductive features which is closest to the capacitor.

3. A manufacturing method of a semiconductor structure, comprising:
    forming a semiconductor device at a substrate;
    forming an interconnect structure on the substrate, wherein the semiconductor device is formed on the substrate, and the interconnect structure is electrically connected to the semiconductor device; and
    forming a capacitor, a plurality of first conductive features and a plurality of second conductive features on the interconnect structure;
    forming a first isolation layer between the capacitor and one of plurality of the first conductive features which is closest to the capacitor; and
    forming a second isolation layer between the capacitor and one of plurality of the second conductive features which is closest to the capacitor,
    wherein a top electrode of the capacitor has an extension portion located on the first isolation layer and at least the one of the plurality of the first conductive features which is closest to the capacitor,
    wherein the capacitor, the plurality of first conductive features and the plurality of second conductive features are respectively electrically connected to the interconnect structure, and
    wherein the capacitor, the plurality of first conductive features and the plurality of second conductive features are in contact with a dielectric layer of the interconnect structure.

4. The manufacturing method of the semiconductor structure of claim 3, wherein a forming method of the capacitor, the plurality of first conductive features and the plurality of second conductive features comprises:
    forming a conductive layer on the interconnect structure;
    patterning the conductive layer to form a bottom of the capacitor, the plurality of first conductive features and the plurality of second conductive features;
    forming an insulating material layer on the bottom electrode, the plurality of first conductive features and the plurality of second conductive features;
    removing the insulating material layer on the plurality of first conductive features and the plurality of second conductive features; and
    forming the top electrode on the insulating material layer on the bottom electrode and at least the one of the plurality of the first conductive features which is closest to the capacitor.

5. The manufacturing method of the semiconductor structure of claim 4, wherein the top electrode covers at least a portion of a top surface of the one of the plurality of the first conductive features which is closest to the capacitor.

\* \* \* \* \*